(12) United States Patent
Lee (10) Patent No.: US 11,973,099 B2
(45) Date of Patent: Apr. 30, 2024

(54) FINGERPRINT IDENTIFICATION MODULE, METHOD FOR MAKING SAME, AND ELECTRONIC DEVICE USING SAME

(71) Applicant: HON HAI PRECISION INDUSTRY CO., LTD., New Taipei (TW)

(72) Inventor: Kuo-Sheng Lee, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 403 days.

(21) Appl. No.: 17/236,158

(22) Filed: Apr. 21, 2021

(65) Prior Publication Data

US 2022/0077213 A1  Mar. 10, 2022

(30) Foreign Application Priority Data

Sep. 10, 2020 (CN) .......................... 202010948682.4

(51) Int. Cl.
| | |
|---|---|
| *G06V 40/13* | (2022.01) |
| *H01L 27/146* | (2006.01) |
| *H01L 25/16* | (2023.01) |
| *H01L 25/18* | (2023.01) |

(52) U.S. Cl.
CPC .... *H01L 27/14625* (2013.01); *G06V 40/1318* (2022.01); *H01L 27/14623* (2013.01); *H01L 27/14634* (2013.01); *H01L 27/14685* (2013.01); *H01L 25/167* (2013.01); *H01L 25/18* (2013.01)

(58) Field of Classification Search
CPC ... G06V 40/1318; H01L 25/167; H01L 25/18; H01L 27/14623; H01L 27/14625; H01L 27/14634; H01L 27/14678; H01L 27/14685
See application file for complete search history.

(56) References Cited

U.S. PATENT DOCUMENTS

| | | | | |
|---|---|---|---|---|
| 2019/0022782 | A1* | 1/2019 | Dejneka | ................ C04B 37/045 |
| 2021/0295076 | A1* | 9/2021 | Li | ...................... G06V 40/1394 |
| 2021/0327941 | A1* | 10/2021 | Lee | ................... H01L 27/14685 |

FOREIGN PATENT DOCUMENTS

| | | | | |
|---|---|---|---|---|
| CN | 106022348 | A * | 10/2016 | ......... G06K 9/00067 |
| TW | I633493 | | 8/2018 | |
| TW | I650875 | | 2/2019 | |

\* cited by examiner

*Primary Examiner* — Meiya Li
(74) *Attorney, Agent, or Firm* — ScienBiziP, P.C.

(57) ABSTRACT

A fingerprint identification module collimating light reflected by fingertip skin patterns defines a fingerprint identification area and a peripheral area, for identifying fingerprints. The module includes a first light-shielding layer, optical sensors, a second light-shielding layer, a supporting portion, and a gap portion. The first and second light-shielding layers each define through holes (first and second through holes). Each second through hole exposes one optical sensor and is aligned with one first through hole. The supporting portion in the peripheral area bonds the first and second substrates, maintaining a certain distance between the first and second light-shielding layers. The gap portion is in the fingerprint identification area. Light reflected by a fingerprint is collimated by the first through holes, the gap portion, and the second through holes and then received as optical signals by the sensors to realize fingerprint imaging.

20 Claims, 8 Drawing Sheets

FINGERPRINT IDENTIFICATION MODULE, METHOD FOR MAKING SAME, AND ELECTRONIC DEVICE USING SAME

FIELD

The subject matter herein generally relates to the technical field of biometrics, and particularly relates to a fingerprint identification module, a method for making the fingerprint identification module and an electronic device using the fingerprint identification module.

BACKGROUND

Generally, a fingerprint identification module adopts either alternately stacked light-shielding layers and cover layers to form a collimating structure for fingerprint imaging, or a lens for fingerprint imaging. However, the collimating structure formed by alternately stacking light-shielding layers and cover layers may require as many as seven to eight film layers to be fabricated in sequence. Such fabrication processes may be difficult. In addition, in a structure using a lens for fingerprint imaging, the lens needs to be thicker than the collimating structure, and compounding with a large fingerprint identification area, the lens may become difficult to manufacture.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Figure 1:
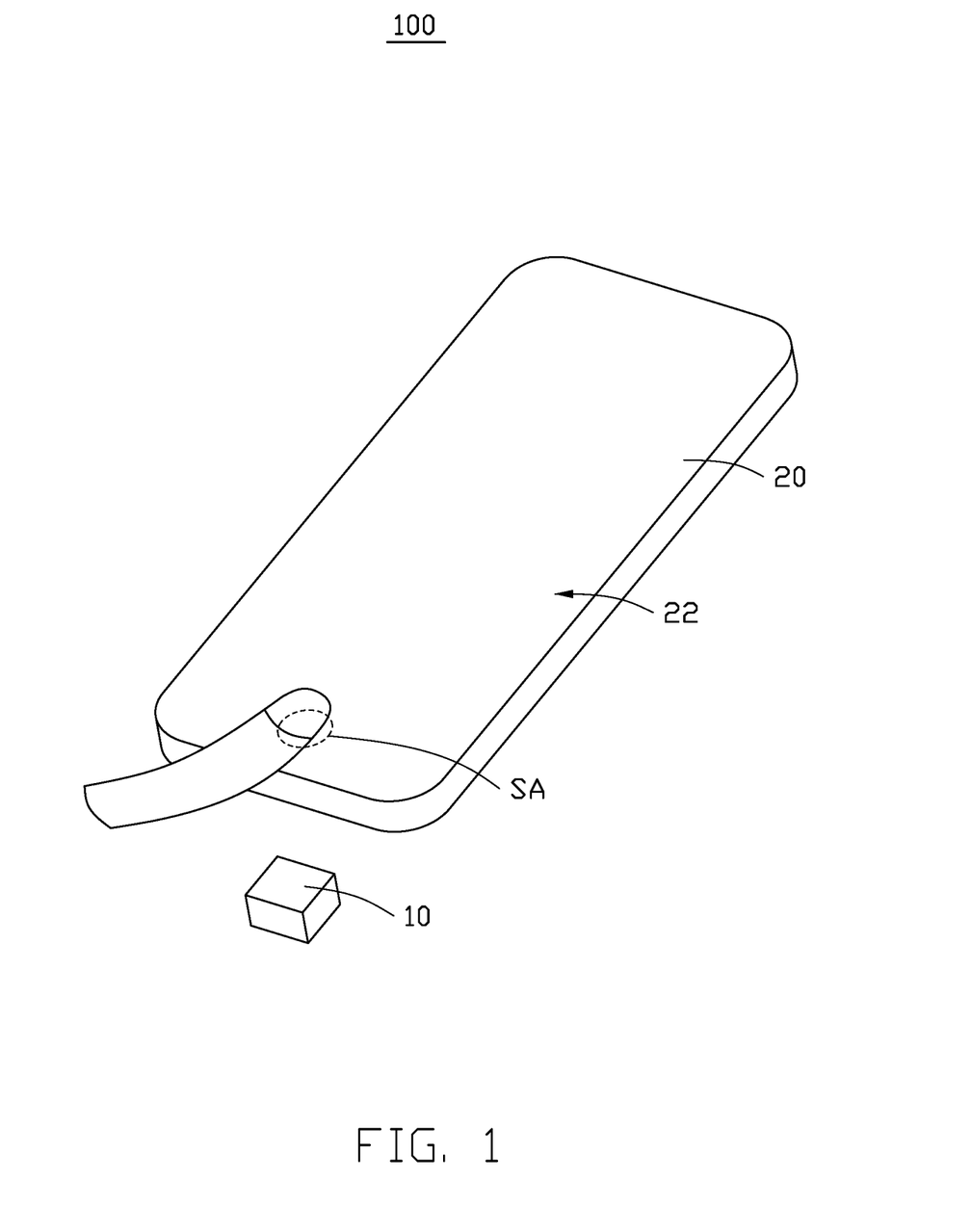
FIG. 1 is a schematic view showing an electronic device with a fingerprint identification module according to an embodiment of the present disclosure.

FIG. 1 shows an electronic device 100 according to an embodiment. The electronic device 100 includes a display panel (DP) 20 and a fingerprint identification module (FIM) 10 under the DP 20. The DP 20 has a display surface 22, and the FIM 10 is on a side of the DP 20 away from the display surface 22. The FIM 10 receives light reflected by an external object (e.g., a fingertip) through the DP 20 and converts the received light into corresponding electrical signals for fingerprint identification.

The DP 20 defines a sensing area SA provided for physical contact with the external object. The FIM 10 is aligned with the sensing area SA. When a fingertip touches the sensing area SA, the FIM 10 can collect a fingerprint image of the finger to obtain fingerprint information.

In one embodiment, the sensing area SA is at least partially in the display area of the DP 20. In other embodiments, the sensing area SA can be extended to the entire display area of the DP 20. The area of the DP 20 for displaying images is defined as a display area, and the area surrounding the display area of the DP 20 is defined as a non-display area.

In one embodiment, the DP 20 may be a self-luminous display panel, which has a plurality of self-illuminating units (not shown). For example, the DP 20 may be an organic light emitting diode (OLED) display panel or a micro light emitting diode (Micro LED) display panel. Some of the self-illuminating units in the DP 20 can be used as a light source for fingerprint detection applied to the reflection of light. When the external object presses the sensing area SA on the DP 20, the DP 20 emits a beam to the finger above the sensing area SA, and the beam is reflected by a surface of the finger to form a reflected light. The reflected light from the finger is received by the FIM 10 and is converted into a corresponding electrical signal to realize fingerprint identification.

In one embodiment, the electronic device 100 may be, but is not limited to, consumer electronic products, home electronic products, vehicle-mounted electronic products, financial terminal products, and so on. The consumer electronic products are, for example, mobile phones, tablet computers, notebook computers, desktop monitors, and all-in-one computers, and the like. The home electronic products are, for example, smart door locks, refrigerators, and the like. The vehicle-mounted electronic products are, for example, car navigation systems, car DVDs, and the like. The financial terminal products are, for example, ATM machines, self-service business terminals, and the like.

The FIM 10 will be described below with reference to FIGS. 2 through 6.

Figure 2:
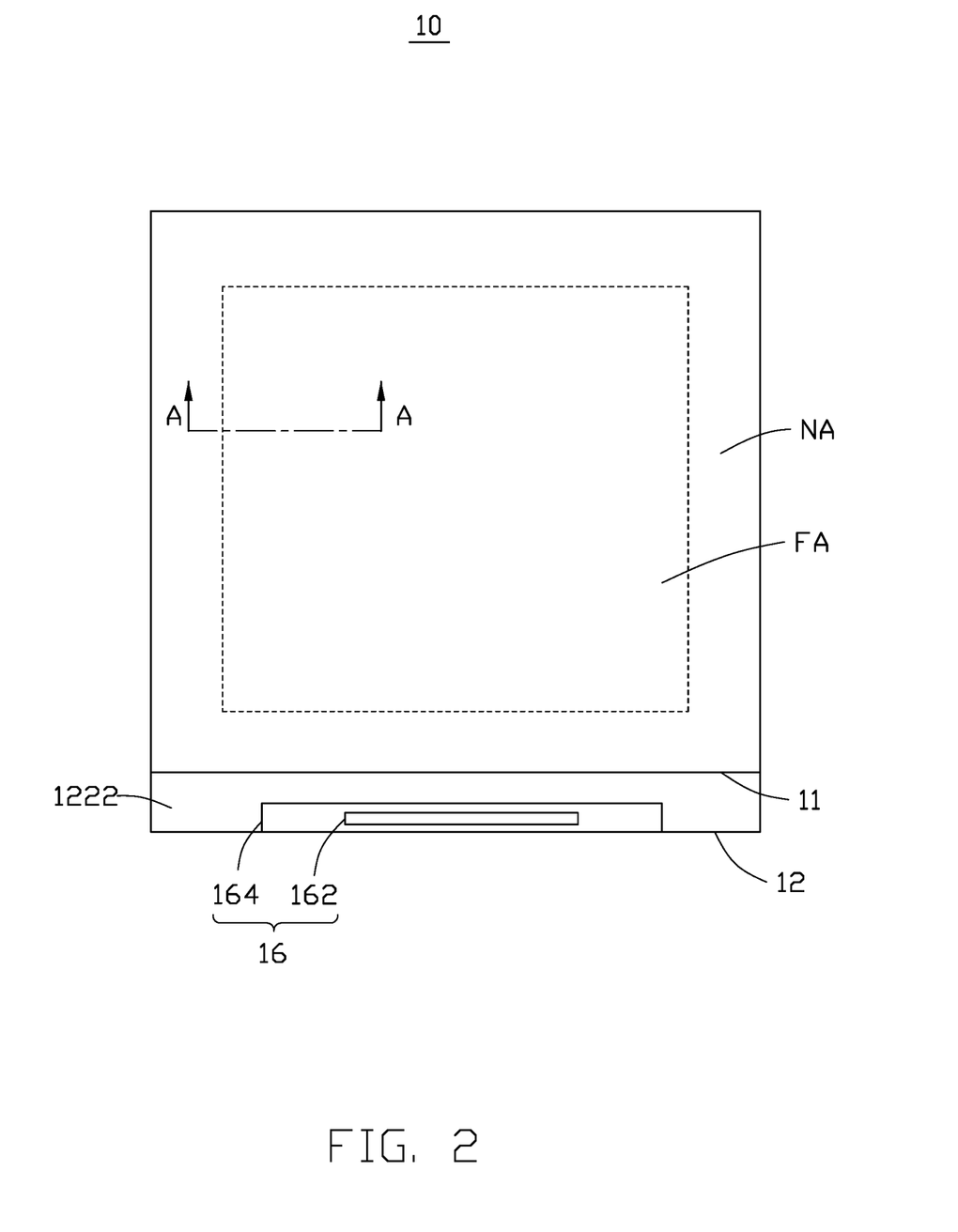
FIG. 2 is a plan view of the fingerprint identification module in FIG. 1.

As shown in FIG. 2, the FIM 10 defines a fingerprint identification area FA and a peripheral area NA surrounding the fingerprint identification area FA. The fingerprint identification area FA of the FIM 10 corresponds to the sensing area SA of the DP 20.

In one embodiment, the fingerprint identification area FA is roughly elliptical, which is roughly the same shape as a fingerprint. In other embodiments, the fingerprint identification area FA may be rectangular.

Figure 3:
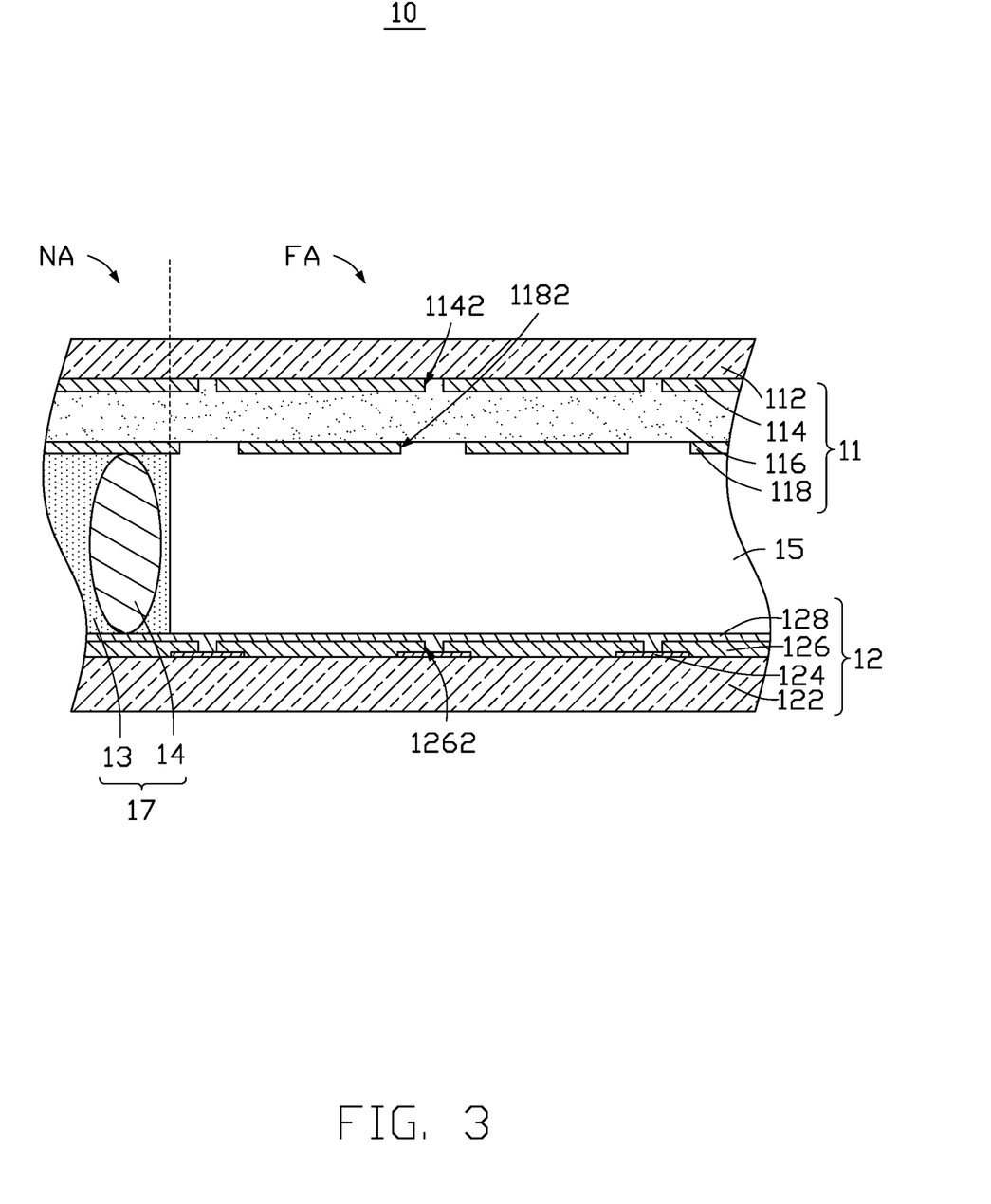
FIG. 3 is a cross-sectional view along line A-A of FIG. 2.

As shown in FIG. 3, the FIM 10 includes a first substrate 11 and a second substrate 12 opposite to the first substrate 11. The first substrate 11 includes a transparent first base layer 112 and an opaque first light-shielding layer 114 on the first base layer 112. The first light-shielding layer 114 defines a plurality of first through holes 1142 spaced apart from each other. The second substrate 12 includes a transparent second base layer 122, a plurality of optical sensors 124, and an opaque second light-shielding layer 126. The optical sensors 124 are on a surface of the second base layer 122 and are spaced apart from each other. The second light-shielding layer 126 is on a side of the optical sensors 124 away from the second base layer 122. The second light-shielding layer 126 defines a plurality of second through holes 1262 spaced apart from each other. Each second through hole 1262 exposes one optical sensor 124 and is aligned with one first through hole 1142. The first light-shielding layer 114, the optical sensors 124 and the second light-shielding layer 126 are all between the first base layer 112 and the second base layer 122.

In one embodiment, the first through holes 1142, the second through holes 1262, and the optical sensor 124 may all be arranged in an array.

As shown in FIG. 3, the FIM 10 includes a supporting portion 17 and a gap portion 15 between the first substrate 11 and the second substrate 12. The supporting portion 17 includes a sealant 13 and a plurality of optical spacers 14 (only one is shown).

The sealant 13 is aligned with the peripheral area NA to bond the first substrate 11 and the second substrate 12. The optical spacers 14 are embedded in the sealant 13 to maintain a distance between the first substrate 11 and the second substrate 12. The gap portion 15 is aligned with the fingerprint identification area FA, so as to collimate the light reflected by the fingertip together with the first light-shielding layer 114 and the second light-shielding layer 126.

Figure 4:
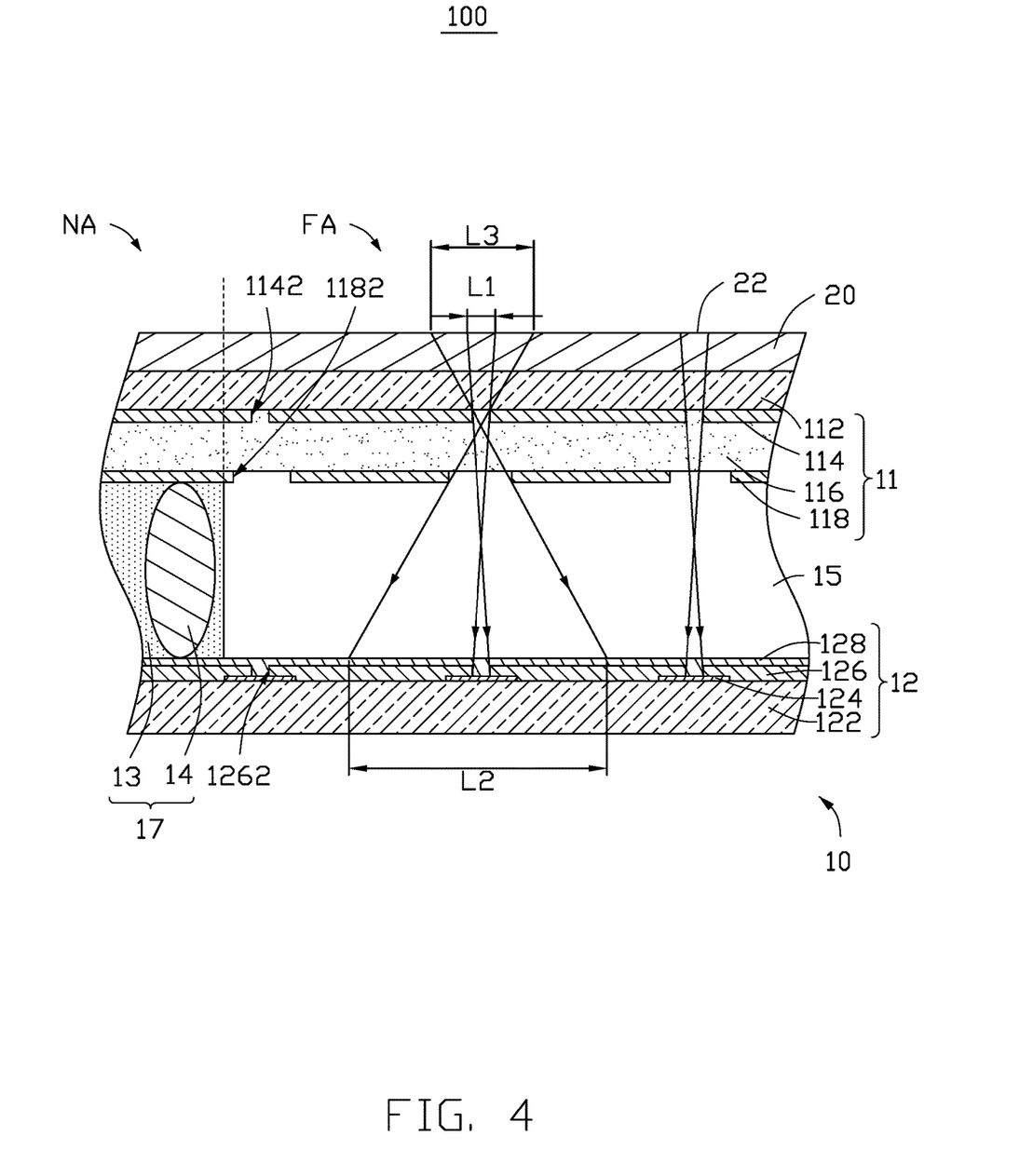
FIG. 4 is a cross-sectional view of part of the electronic device in FIG. 1.

FIG. 4 shows an electronic device 100 using the FIM 10. The FIM 10 is on a side of the DP 20 away from the display surface 22. Some of the self-illuminating units in the DP 20 are used as the light source of the FIM 10. When a finger touches the sensing area SA (i.e., fingerprint identification area FA), the light emitted by the self-illuminating units in the DP 20 is incident on the display surface 22 and is reflected by valleys and ridges of the fingertip (i.e., the fingerprint). The light reflected by the fingerprint is collimated and received by the optical sensors 124. The optical sensors 124 sense the light as signals realizing an image of a fingerprint.

In one embodiment, each optical sensor 124 includes a photodiode, which can convert the received light (e.g., the differences in light intensity) into a difference in electrical terms, so as to realize fingerprint identification and determine the fingerprint image.

In FIG. 4, the light reflected by the finger passes through the DP 20, the first substrate 11, and the gap portion 15 in that order and is received by the optical sensors 124. The light reflected by the finger is blocked at the position of the first light-shielding layer 114 where the first through holes 1142 are not opened and the position of the second light-shielding layer 126 where the second through holes 1262 are not opened. The light reflected by the finger passes through the first through holes 1142 (small holes structure) and the third through holes 1182 and forms an image on the optical sensors 124. Thus, the collimating structure formed by the first and second light-shielding layers 114, and 126 limits a size range of fingerprints that each optical sensor 124 can collect (L1 in FIG. 4). In addition, since the light in the area around the size range of fingerprint L1 is absorbed by the unopened areas of the first and the third light-shielding layers 114, and 118, light which would otherwise interfere with a clear fingerprint image is reduced, and an accuracy of fingerprint identification is improved.

A distance between adjacent wave crests of an ordinary person's fingerprint is about 500-600 microns. That is, a fingerprint spacing (the distance between a wave trough and an adjacent wave crest) of an ordinary person is about 250 microns to 300 microns. In one embodiment, the size range of fingerprints collected by each optical sensor 124 is adjusted by changing a distance from the display surface 22 to the optical sensors 124, a size of each first through hole 1142, and a size of each second through hole 1262, so that the size range of fingerprints L1 collected by each optical sensor 124 is 200 microns to 400 microns. If the size range of fingerprints L1 is less than 200 microns, the detection light source of the DP 20 may be insufficient. If the size range of fingerprints L1 is greater than 400 microns, a resolution of the fingerprint image is poor, and the fingerprint identification accuracy will be low.

In one embodiment, the fingerprint ranges collected by two adjacent optical sensors 124 do not overlap. That is, an object image area corresponding to two adjacent imaging areas do not overlap, so as to improve a signal-to-noise ratio detected by the optical sensors 124.

In one embodiment, the first through holes 1142 and the third through holes 1182 are both circular holes. A size of each first through hole 1142 is equal to a size of each third through hole 1182. A ratio of the diameter of each first through hole 1142 (i.e., the diameter of each third through hole 1182) to the distance between the display surface 22 and the optical sensors 124 is approximately 1:7, so that the light reflected by the finger is well-collimated. In other embodiments, the first through holes 1142 and the third through holes 1182 may be, but are not limited to being, rectangular.

In one embodiment, the first base layer 112 and the second base layer 122 are both made of transparent materials, for example, glass. The first light-shielding layer 114 and the second light-shielding layer 126 may be made of an opaque material, for example, organic black matrix or metal.

In one embodiment, the gap portion 15 is air. That is, the gap portion 15 is an air gap. In the FIM 10, the first light-shielding layer 114, the gap portion 15 (air gap), and the second light-shielding layer 126 form a collimating structure. The optical spacers 14 are formed in the peripheral area NA of the FIM 10 to maintain a certain distance between the first substrate 11 and the second substrate 12, so that there is a certain thickness exists between the first light-shielding layer 114 and the second light-shielding layer 126 in the fingerprint recognition area FA, to achieve light collimation. Compared with stacking multiple layers (up to seven to eight layers) of light-shielding layer and cover layers in sequence to maintain a certain thickness of the collimating structure, the FIM 10 reduces the number of film layers and simplifies the manufacturing. In addition, the production of the gap portion 15 (air gap) of the FIM 10 is not limited by an area of the fingerprint identification area FA. Compared with the method of using a lens for fingerprint imaging, manufacturing process is further simplified.

In other embodiments, the gap portion 15 may be a transparent medium. The transparent medium is, for example, an optically clear resin (OCR). That is, in the FIM 10, the first light-shielding layer 114, the gap portion 15 (transparent medium), and the second light-shielding layer 126 form a collimating structure. The optical spacers 14 are formed in the peripheral area NA of the FIM 10 to maintain a certain distance between the first substrate 11 and the second substrate 12, and the fingerprint identification area FA is filled with the transparent medium, so that a certain thickness exists between the first light-shielding layer 114 and the second light-shielding layer 126 in the fingerprint recognition area FA, to achieve light collimation. Similarly, compared with stacking multiple layers (up to seven to eight layers) of light-shielding layer and cover layers in sequence to maintain a certain thickness of the collimating structure, the FIM 10 reduces the number of film layers. In addition, the production of the gap portion 15 (transparent medium) of the FIM 10 is not limited by the area of the fingerprint identification area FA. Compared with the method of fingerprint imaging using a lens, production is further simplified.

In one embodiment, the first substrate 11 further includes a transparent cover layer 116, and an opaque third light-shielding layer 118. The transparent cover layer 116 is on a side of the first light-shielding layer 114 away from the first base layer 112. The third light-shielding layer 118 is on a surface of the cover layer 116 away from the first base layer 112. The third light-shielding layer 118 defines a plurality of third through holes 1182 spaced apart from each other. Each of the third through holes 1182 is aligned with one first through hole 1142 and one second through hole 1262.

As shown in FIG. 4, along a thickness direction of the first substrate 11, a projection of one third through hole 1182 on the first base layer 112 completely covers a projection of one first through hole 1142 on the first base layer 112. A maximum imaging size (L2 in FIG. 4) of the light as signals reflected by the fingerprint on the second base layer 122, after being collimated sequentially by the first through holes 1142, the third through holes 1182 and the gap portion 15, is less than a distance between two adjacent optical sensors 124. That is, the third light-shielding layer 118 is between the first light-shielding layer 114 and the second light-shielding layer 126 and can absorb a portion of the light reflected by the finger, so that the light reflected by the finger in the area of the fingerprint range L3 is received by only one optical sensor 124. Thus, the light as optical signals detected by the adjacent optical sensors 124 do not interfere with each other, which improves the accuracy of fingerprint identification.

In one embodiment, the third light-shielding layer 118 may be made of an opaque material, for example, organic black matrix or metal. The cover layer 116 may be made of a transparent resin. In one embodiment, the material of the third light-shielding layer 118 is metal, the second substrate 12 further includes a protective layer 128. The protective layer 128 fills the second through holes 1262 and completely covers the third light-shielding layer 118 to prevent oxidation of the third light-shielding layer 118. The protective layer 128 may be made of a silicon oxide (SiOx) layer, a silicon nitride (SiNx) layer, or a combination.

In one embodiment, the sizes of the first, second, and third through holes 1142, 1262, and 1182 are related to a height of the cover layer 116 and a height of the gap portion 15. In one embodiment, the diameters of the first through holes 1142 and the second through holes 1262 are both 4 microns, the height of the covering layer 116 is approximately 6 microns to 10 microns, and the height of the gap portion 15 is approximately 25 microns to 35 microns, so that the light reflected by the finger is well-collimated between the display surface 22 and the optical sensors 124.

The optical spacer 14 shown in FIG. 4 is a spherical optical spacer. A plurality of spherical optical spacers 14 are scattered and embedded in the sealant 13. Opposite ends of each optical spacer 14 are supported on the first substrate 11 and the second substrate 12, so that there is a certain distance between the first, and second light-shielding layers 114 and 126. The first light-shielding layer 114, the gap portion 15 and the second light-shielding layer 126 constitute a collimating structure to collimate the light reflected by the finger. Due to the arrangement of the optical spacers 14, a thickness can be maintained between the first, and second light-shielding layers 114, and 126, which avoids manufacturing process of sequential multiple layers and reduces the manufacturing difficulty. In addition, regardless of whether the gap portion 15 is an air gap or filled with a transparent medium, its production is not limited by the area of the fingerprint identification area FA. Compared with the method of using a lens for fingerprint imaging, it also reduces the production difficulty.

In other embodiments, each optical spacer 14 may be columnar, and a plurality of columnar optical spacers 14 are dispersed in the sealant 13 spaced from each other. One end of each columnar optical spacer 14 is formed on the first substrate 11, and the other end of each columnar optical spacer 14 is against the second substrate 12. Conversely, one end of each columnar optical spacer 14 may be formed on the second substrate 12, and the other end is against the first substrate 11. In other embodiments, each optical spacer 14 may be a closed or open strip-shaped retaining wall surrounding the fingerprint identification area FA. Opposite ends of the retaining wall resist the first substrate 11 and the second substrate 12.

Figure 5A:
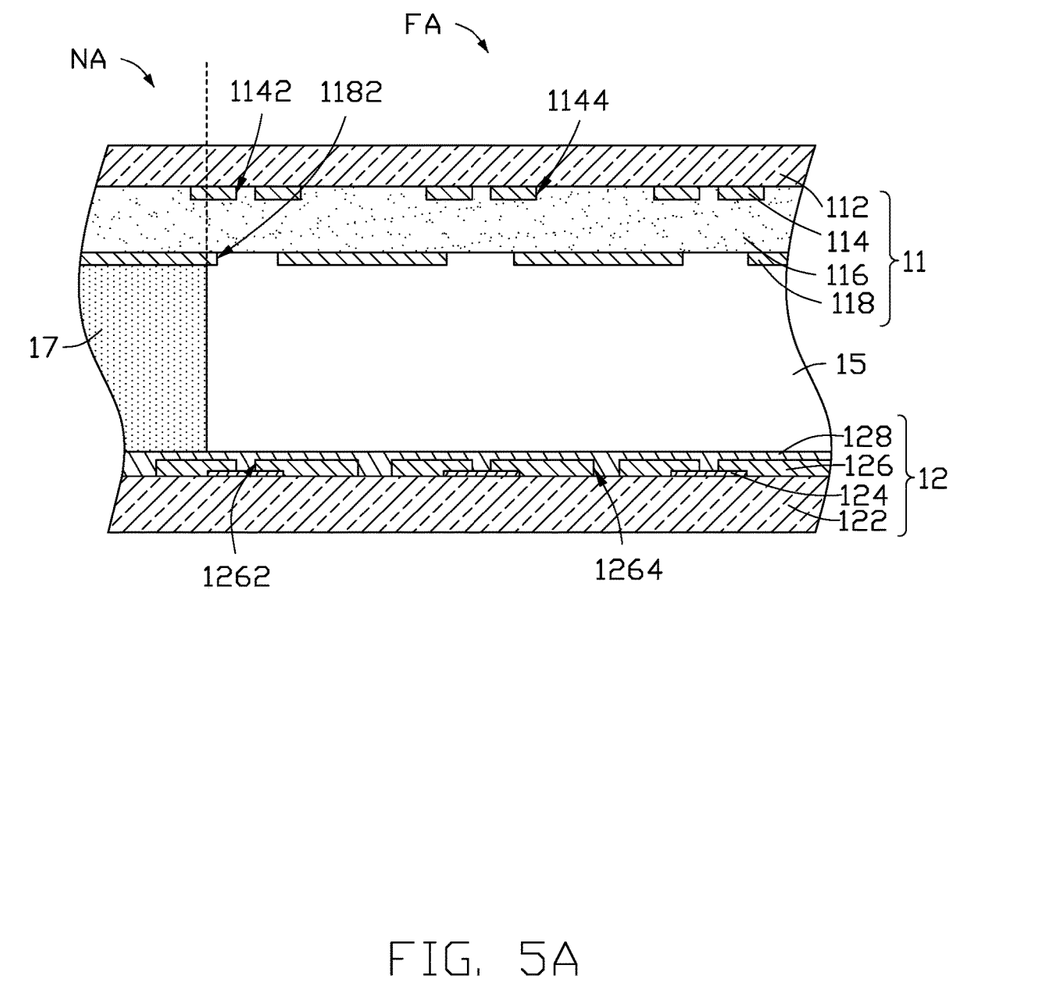
FIG. 5A is a cross-sectional view of part of the fingerprint identification module according to another embodiment of the present disclosure.

FIG. 5A shows a fingerprint identification module (FP) according to another embodiment. A difference between the FP in FIG. 5A and the FIM 10 in FIG. 4 is that the supporting portion 17 in FIG. 5A is a transparent adhesive layer. In FIG. 5A, the first substrate 11 and the second substrate 12 are attached to each other through the supporting portion 17. In addition, a thickness of the support portion 17 can be adjusted to change the distance between the first substrate 11 and the second substrate 12. In one embodiment, the adhesive layer may be a transparent tape, for example, polyethylene terephthalate (PET), but it is not limited thereto.

Figure 5B:
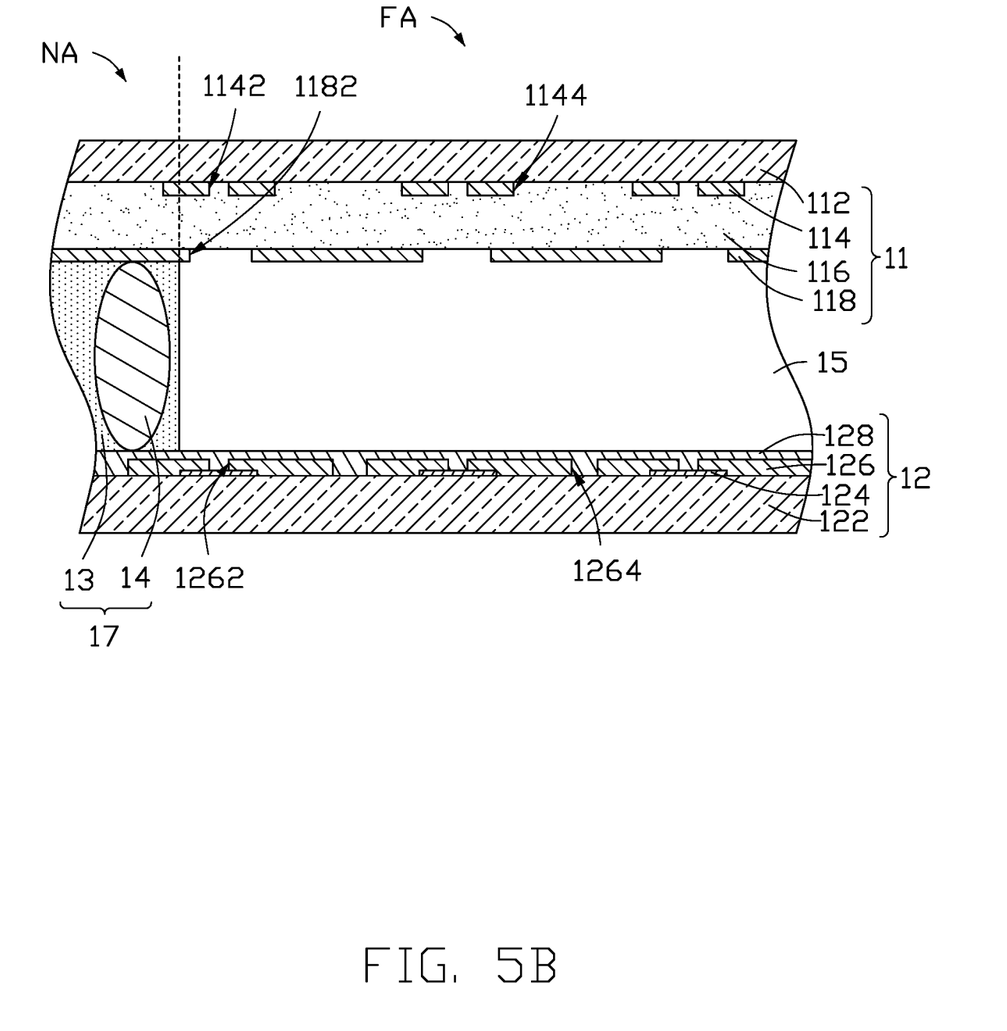
FIG. 5B is a cross-sectional view of part of the fingerprint identification module according to another embodiment of the present disclosure.

FIG. 5B shows a FIM 10 according to another embodiment. A difference between the FP in FIG. 5B and the FIM 10 in FIG. 4 is that in the FIG. 5B FIM 10, the first light-shielding layer 114 further defines a plurality of first openings 1144 spaced apart from each other, and the second light-shielding layer 126 also further defines a plurality of second openings 1264 spaced apart from each other. Along the thickness direction of the first substrate 11, projections of each first opening 1144 and each second opening 1264 on the first base layer 112 fall on the third light-shielding layer 118. That is, even if the light reflected by the finger passes through the first openings 1144, it can be absorbed by the third light-shielding layer 118 without reaching the optical sensors 124. Additionally, since the third light-shielding layer 118 can absorb part of the light above the second openings 1264, the cross-interference of light is avoided, and the fingerprint identification accuracy is improved.

In one embodiment, a light-shielding material layer is formed on the first base layer 112 first, and the light-shielding material layer is patterned to form the first openings 1144 and the first through holes 1142 by a single exposure process. Thus, the first light-shielding layer 114 is obtained. Since the first openings 1144 and the first through holes 1142 can be formed by a single exposure process, the manufacturing process is simplified. Similarly, the second openings 1264 and the second through holes 1262 can also be formed by a single exposure process to further simplify the manufacturing process.

Referring again to FIG. 1, the FIM 10 includes a fingerprint identification chip 162. The optical sensors 124 are electrically connected to the fingerprint identification chip 162. In FIG. 1, a chip on film 16 includes a flexible circuit board 164. The fingerprint identification chip 162 is fixed on the flexible circuit board 164. That is, in FIG. 1, the fingerprint identification chip 162 is packaged by a chip on film (COF) method. After the second substrate 12 and the first substrate 11 are bonded by the sealant 13, the second base layer 122 has a protruding area 1222 extending beyond the first substrate 11. The chip on film 16 is in the protruding area 1222.

Figure 6:
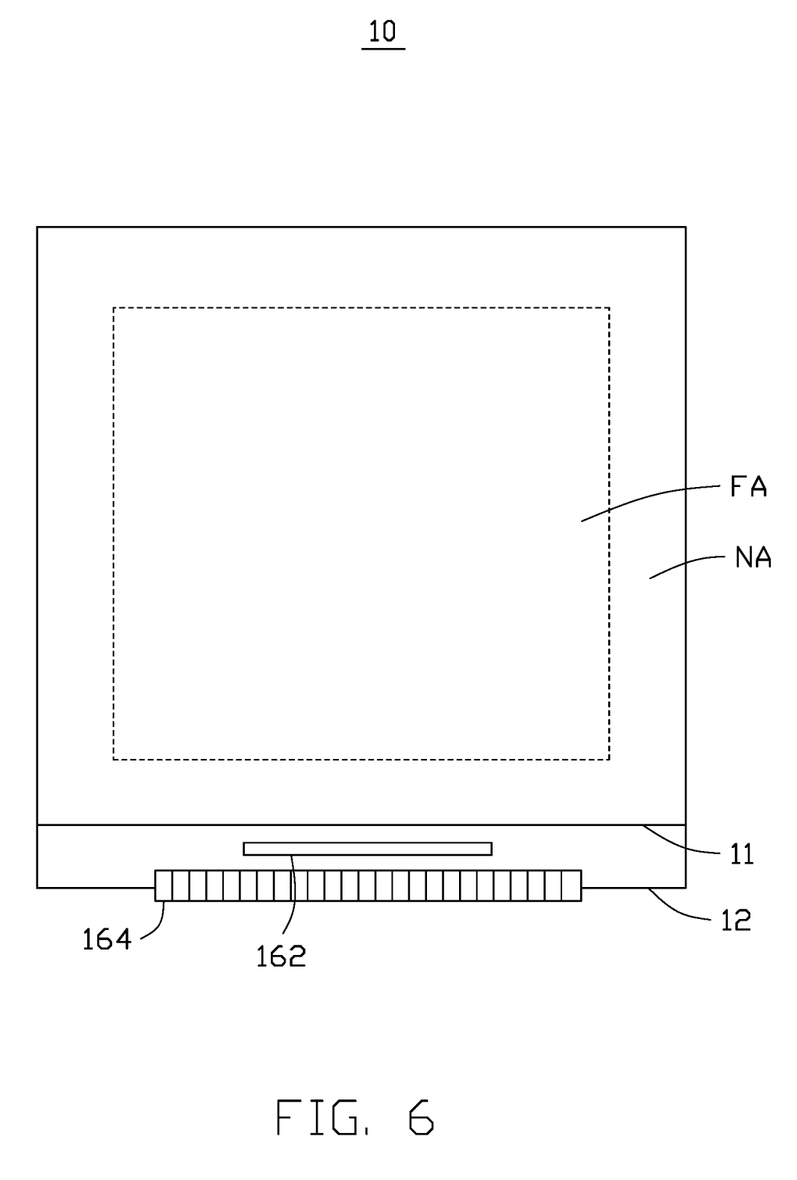
FIG. 6 is a plan view of the fingerprint identification module according to another embodiment of the present disclosure.

In another embodiment, the fingerprint identification chip 162 is packaged by a chip on glass (COG) method. As shown in FIG. 6, the fingerprint identification chip 162 is fixed on the second base layer 122. The fingerprint identification chip 162 may be connected to the flexible circuit board 164 through traces (not shown).

Figure 7:
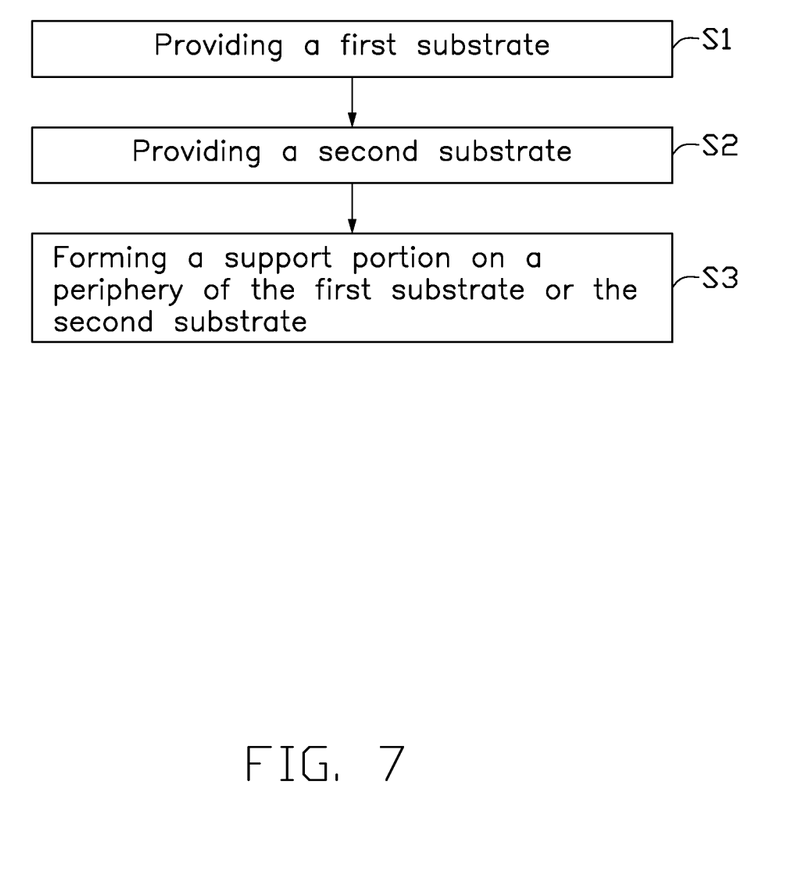
FIG. 7 is a flow chart of a method for making the fingerprint identification module according to an embodiment of the present disclosure.

FIG. 7 shows a flowchart of a method for making a fingerprint identification module according to an embodiment. The example method is provided by way of example, as there are a variety of ways to carry out the method. The method described below can be carried out using the configurations illustrated in FIGS. 3 through 5B, for example, and various elements of these figures are referenced in explaining the example method. Each block shown in FIG. 7 represents one or more processes, methods, or subroutines carried out in the example method. Furthermore, the illustrated order of blocks is by example only, and the order of the blocks can be changed. Additional blocks can be added, or fewer blocks can be utilized, without departing from this disclosure. The example method can begin at block S1.

Block S1: a first substrate is provided.

In one embodiment, providing the first substrate includes providing a transparent first base layer 112, forming a light-shielding material layer (not shown) on the first base layer 112, and patterning the light-shielding material layer to form the first through holes 1142 spaced apart from each other. The first light-shielding layer 114 on the first base layer 112 is obtained.

In another embodiment, patterning the light-shielding material layer further forms a plurality of first openings 1144 spaced apart from each other, and each first opening 1144 is between two adjacent first through holes 1142.

In another modified embodiment, providing the first substrate further includes forming a cover layer 116 on a side of the first light-shielding layer 114 away from the first base layer 112, and forming a light-shielding material layer (not shown) on a side of the cover layer 116 away from the first base layer 112, and patterning the light-shielding material layer to form a plurality of third through holes 1182 spaced apart from each other. The third light-shielding layer 118 on the cover layer 116 is obtained.

In one embodiment, the material of the first base layer 112 is glass, and the material of the first light-shielding layer 114 and the third light-shielding layer 118 are opaque materials such as black matrix or metal.

Block S2: a second substrate is provided.

In one embodiment, providing the second substrate 12 includes providing a transparent second base layer 122, forming a plurality of optical sensors 124 spaced apart on the second base layer 122, and forming a light-shielding material layer (not shown) on a side of the optical sensors 124 away from the second base layer 122, and patterning the light-shielding material layer to form a plurality of second through holes 1262 spaced apart from each other. Each of the second through holes 1262 exposes one of the optical sensors 124. The second light-shielding layer 126 is obtained.

In one embodiment, the material of the second base layer 122 is glass, and the material of the second light-shielding layer 126 is an opaque material such as black matrix or metal.

Block S3: a supporting portion is formed on a periphery of the first substrate or the second substrate. The supporting portion adheres the first substrate and the second substrate and maintains a distance between the first substrate and the second substrate.

In one embodiment, the supporting portion 17 is a transparent adhesive layer. In Block S3, the first substrate 11 and the second substrate 12 can be aligned with each other using a transparent tape (e.g., PET) of a desired thickness.

In another embodiment, the supporting portion 17 includes a sealant 13 and a plurality optical spacers 14. Block S3 includes forming the sealant 13 and the optical spacers 14 on the periphery of the first substrate 11 or the second substrate 12. The optical spacers 14 are in the sealant 13.

In one embodiment, each optical spacer 14 is a spherical optical spacer. The sealant 13 is formed on the periphery of the first substrate 11 or the second substrate 12, and then optical spacers 14 are dispersed in the sealant 13.

In another embodiment, each optical spacer 14 may be columnar. The columnar optical spacers 14 may be formed on the periphery of the first substrate 11 or the second substrate 12 first, and then the sealant 13 may be coated so that the optical spacers 14 are embedded in the sealant 13.

In another embodiment, each optical spacer 14 is a strip-shaped retaining wall. A long retaining wall can be formed on the periphery of the first substrate 11 or the second substrate 12 first, and then the sealant 13 can be coated so that the optical spacers 14 are embedded in the sealant 13.

It should be noted that the steps of forming the optical spacer 14 and the sealant 13 are not limited thereto, and reference may be made to the manufacturing steps of the optical spacers and sealant in a liquid crystal display panel.

After the first substrate 11 and the second substrate 12 are bonded, each of the second through holes 1262 is aligned with one of the first through holes 1142, the first light-shielding layer 114, the optical sensors 124, and the second light-shielding layer 126 are all between the first base layer 112 and the second base layer 122. The optical spacers 14 maintain a distance between the first substrate 11 and the second substrate 12, and the area enclosed by the sealant 13 between the first substrate 11 and the second substrate 12 forms the gap portion 15.

In one embodiment, the material of the gap portion 15 is a transparent medium. In block S3, it further includes filling the transparent medium in the area enclosed by the sealant 13. The transparent medium may be a transparent resin.

In one embodiment, the method further includes providing a fingerprint identification chip 162 and disposing the fingerprint identification chip 162 on the second base layer 122 by a flexible circuit board carrying chip packaging method or a glass carrying chip packaging method.

The method for making the fingerprint identification module can refer to the method for making the liquid crystal display panel. The optical spacers 14 between the first substrate 11 and the second substrate 12 allow a thickness to be maintained between the first light-shielding layer 114 and the second light-shielding layer 126, avoiding the production of sequential multiple layers and reducing the manufacturing difficulty. In addition, regardless of whether the gap portion 15 is an air gap or filled with a transparent medium, its production is not limited by the area of the fingerprint identification area FA. Compared with the method of fingerprint imaging using a lens, the production difficulty is also reduced.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A fingerprint identification module having a fingerprint identification area and a peripheral area surrounding the fingerprint identification area, comprising:
   a first substrate comprising a first base layer and a first light-shielding layer on the first base layer, wherein the first base is transparent, the first light-shielding layer is opaque and defines a plurality of first through holes spaced apart from each other;
   a second substrate comprising a second base layer, a plurality of optical sensors on the second base layer and spaced apart from each other, and a second light-shielding layer on a side of the plurality of optical sensors away from the second base layer, wherein the second base layer is transparent, the second light-shielding layer is opaque and defines a plurality of second through holes spaced apart from each other, each of the plurality of second through holes exposes a corresponding one of the plurality of optical sensors and is aligned with a corresponding one of the plurality of first through holes, the first light-shielding layer, the plurality of optical sensors, and the second light-shielding layer are sequentially sandwiched between the first base layer and the second base layer;
   a supporting portion between the first base layer and the second base layer and arranged in the peripheral area, wherein the supporting portion bonds the first substrate and the second substrate together and maintains a distance between the first substrate and the second substrate; and
   a gap portion between the first substrate and the second substrate and arranged in the fingerprint identification area,
   wherein the plurality of optical sensors is configured to receive and sense an optical signal which is reflected by a fingerprint, then collimated by the plurality of first through holes, the gap portion, and the plurality of second through holes, and the plurality of the optical sensors collects an image of the fingerprint;
   the first substrate further comprises a third light-shielding layer, the third light-shielding layer defines a plurality of third through holes spaced apart from each other, and each of the plurality of third through holes is aligned with the corresponding one of the plurality of first through holes and a corresponding one of the plurality of second through holes; and
   a maximum imaging size of the optical signal reflected by the fingerprint on the second substrate after being collimated sequentially by the plurality of first through holes, the plurality of third through holes and the gap portion is less than a distance between any two adjacent ones of the plurality of optical sensors.

2. The fingerprint identification module of claim 1, wherein the supporting portion comprises a sealant and at least one optical spacer embedded in the sealant.

3. The fingerprint identification module of claim 1, wherein the supporting portion is a transparent adhesive layer.

4. The fingerprint identification module of claim 1, wherein a material of the gap portion is air or a transparent medium.

5. The fingerprint identification module of claim 1, wherein the first substrate further comprises a transparent cover layer;
   the transparent cover layer is on a side of the first light-shielding layer away from the first base layer, and the third light-shielding layer is on a surface of the transparent cover layer away from the first base layer.

6. The fingerprint identification module of claim 1, wherein a size range of the fingerprint collected by each of the plurality of optical sensors is 200 microns to 400 microns.

7. The fingerprint identification module of claim 1, wherein a size range of the fingerprint collected by any two adjacent ones of the plurality of optical sensors do not overlap.

8. The fingerprint identification module of claim 1, further comprising a fingerprint identification chip, wherein the plurality of optical sensors is electrically connected to the fingerprint identification chip.

9. The fingerprint identification module of claim 8, wherein the fingerprint identification chip is packaged by a chip on film method or by a chip on glass method.

10. A method for making a fingerprint identification module, comprising:
    providing a first substrate, wherein the first substrate is provided with a first base layer and a first light-shielding layer on the first base layer, wherein the first base is transparent, the first light-shielding layer is opaque and defines a plurality of first through holes spaced apart from each other;
    providing a second substrate, wherein the second substrate is provided with a second base layer, a plurality of optical sensors on the second base layer spaced apart from each other, and a second light-shielding layer on a side of the plurality of optical sensors away from the second base layer, wherein the second base layer is transparent, the second light-shielding layer is opaque and defines a plurality of second through holes spaced apart from each other, and each of the plurality of second through holes exposes a corresponding one of the plurality of optical sensors; and
    forming a support portion on a periphery of the first substrate or the second substrate, wherein the support portion bonds the first substrate and the second substrate together and maintains a distance between the first substrate and the second substrate;

wherein each of the plurality of second through holes is aligned with a corresponding one of the plurality of first through holes;

the first light-shielding layer, the plurality of optical sensors, and the second light-shielding layer are sequentially sandwiched between the first substrate and the second substrate;

an area enclosed by the supporting portion between the first substrate and the second substrate forms a gap portion;

the first substrate is further provided with a third light-shielding layer, the third light-shielding layer defines a plurality of third through holes spaced apart from each other, and each of the plurality of third through holes is aligned with the corresponding one of the plurality of first through holes and a corresponding one of the plurality of second through holes; and a maximum imaging size of the optical signal reflected by the fingerprint on the second substrate after being collimated sequentially by the plurality of first through holes, the plurality of third through holes and the gap portion is less than a distance between any two adjacent ones of the plurality of optical sensors.

11. The method for making the fingerprint identification module of claim 10, wherein the supporting portion comprises a sealant and at least one optical spacer embedded in the sealant.

12. The method for making the fingerprint identification module of claim 10, wherein the supporting portion is a transparent adhesive layer.

13. An electronic device, comprising:
a display panel having a display surface; and
a fingerprint identification module on a side of the display panel away from the display surface,
wherein the fingerprint identification module having a fingerprint identification area and a peripheral area surrounding the fingerprint identification area, and
wherein the fingerprint identification module comprises:
a first substrate comprising a first base layer and a first light-shielding layer on the first base layer, wherein the first base is transparent, the first light-shielding layer is opaque and defines a plurality of first through holes spaced apart from each other;
a second substrate comprising a second base layer, a plurality of optical sensors on the second base layer and spaced apart from each other, and a second light-shielding layer on a side of the plurality of optical sensors away from the second base layer, wherein the second base layer is transparent, the second light-shielding layer is opaque and defines a plurality of second through holes spaced apart from each other, each of the plurality of second through holes exposes a corresponding one of the plurality of optical sensors and is aligned with a corresponding one of the plurality of first through holes, the first light-shielding layer, the plurality of optical sensors and the second light-shielding layer are sequentially sandwiched between the first base layer and the second base layer;

a supporting portion between the first base layer and the second base layer and arranged in the peripheral area, wherein the supporting portion bonds the first substrate and the second substrate together and maintains a distance between the first substrate and the second substrate; and a gap portion between the first substrate and the second substrate and arranged in the fingerprint identification area, wherein the plurality of optical sensors is configured to receive and sense an optical signal which is reflected by a fingerprint, then collimated by the plurality of first through holes, the gap portion, and the plurality of second through holes, and the plurality of the optical sensors collects an image of the fingerprint;

the first substrate further comprises a third light-shielding layer, the third light-shielding layer defines a plurality of third through holes spaced apart from each other, and each of the plurality of third through holes is aligned with the corresponding one of the plurality of first through holes and a corresponding one of the plurality of second through holes; and a maximum imaging size of the optical signal reflected by the fingerprint on the second substrate after being collimated sequentially by the plurality of first through holes, the plurality of third through holes and the gap portion is less than a distance between any two adjacent ones of the plurality of optical sensors.

14. The electronic device of claim 13, wherein the supporting portion comprises a sealant and at least one optical spacer embedded in the sealant.

15. The electronic device of claim 13, wherein the supporting portion is a transparent adhesive layer.

16. The electronic device of claim 13, wherein a material of the gap portion is air or a transparent medium.

17. The electronic device of claim 13, wherein the first substrate further comprises a transparent cover layer;
the transparent cover layer is on a side of the first light-shielding layer away from the first base layer, and the third light-shielding layer is on a surface of the transparent cover layer away from the first base layer.

18. The electronic device of claim 13, wherein a size range of the fingerprint collected by each of the plurality of optical sensors is 200 microns to 400 microns.

19. The electronic device of claim 13, wherein a size range of the fingerprint collected by any two adjacent ones of the plurality of optical sensors do not overlap.

20. The electronic device of claim 13, wherein the fingerprint identification module further comprises a fingerprint identification chip, the plurality of optical sensors is electrically connected to the fingerprint identification chip, and the fingerprint identification chip is packaged by a chip on film method or by a chip on glass method.

* * * * *